(12) United States Patent
Fueldner et al.

(10) Patent No.: US 8,428,286 B2
(45) Date of Patent: Apr. 23, 2013

(54) MEMS MICROPHONE PACKAGING AND MEMS MICROPHONE MODULE

(75) Inventors: Marc Fueldner, Neubiberg (DE); Martin Wurzer, Munich (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 312 days.

(21) Appl. No.: 12/627,833

(22) Filed: Nov. 30, 2009

(65) Prior Publication Data

US 2011/0127623 A1 Jun. 2, 2011

(51) Int. Cl.
*H01L 29/84* (2006.01)
*H01L 21/50* (2006.01)

(52) U.S. Cl.
USPC .......................... 381/369; 381/175; 257/416

(58) Field of Classification Search .................. 381/175, 381/176; 257/416
See application file for complete search history.

(56) References Cited

U.S. PATENT DOCUMENTS

| 7,673,375 | B2 | 3/2010 | Chang et al. |
| 2008/0164545 | A1* | 7/2008 | Hsiao ............................ 257/416 |
| 2008/0217709 | A1* | 9/2008 | Minervini et al. ............ 257/416 |
| 2008/0247585 | A1 | 10/2008 | Leidl et al. |
| 2008/0298621 | A1 | 12/2008 | Theuss et al. |
| 2009/0161894 | A1 | 6/2009 | Kimura |

FOREIGN PATENT DOCUMENTS

| DE | 102005008512 A1 | 8/2006 |
| DE | 10 2005 051 604 A1 | 11/2006 |
| DE | 10 2008 007 682 A1 | 12/2008 |
| EP | 0789390 B1 | 8/1997 |

* cited by examiner

*Primary Examiner* — Yuwen Pan
*Assistant Examiner* — Phan Le
(74) *Attorney, Agent, or Firm* — Slater & Matsil, L.L.P.

(57) ABSTRACT

A method for producing a microphone module includes arranging a MEMS microphone structure on a first surface of a first substrate, the first substrate further including a second surface, which is opposite to the first surface. Furthermore, a cap is arranging on the first surface of the first substrate such that the cap and the first surface enclose the MEMS microphone structure. A readout device for the MEMS microphone structure is arranged on a first surface of a second substrate which further includes a second surface, which is opposite to the first surface. The second surface of the first substrate is attached to the second surface of the second substrate.

26 Claims, 11 Drawing Sheets

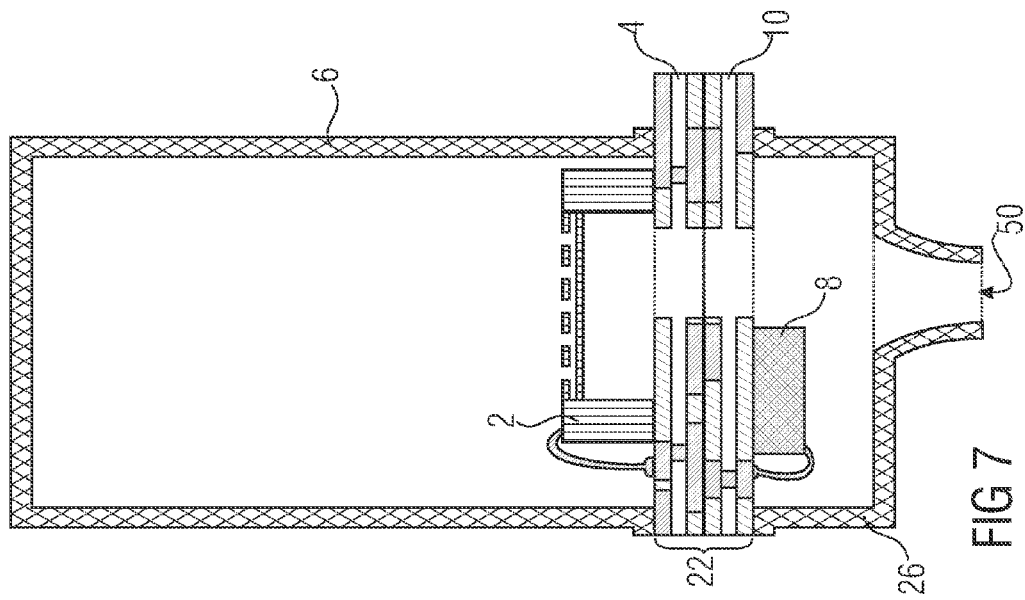
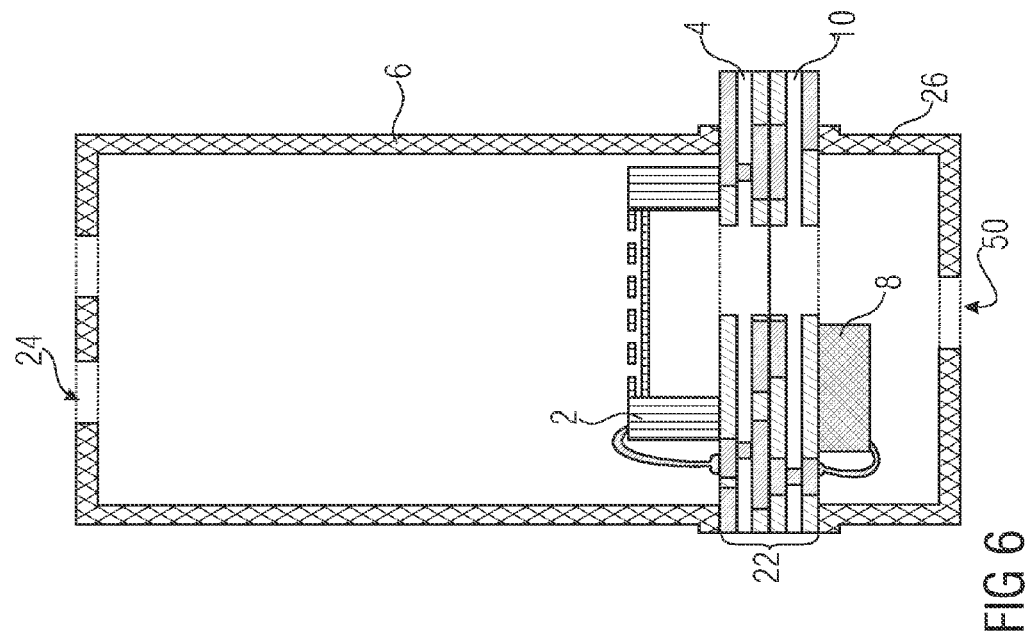

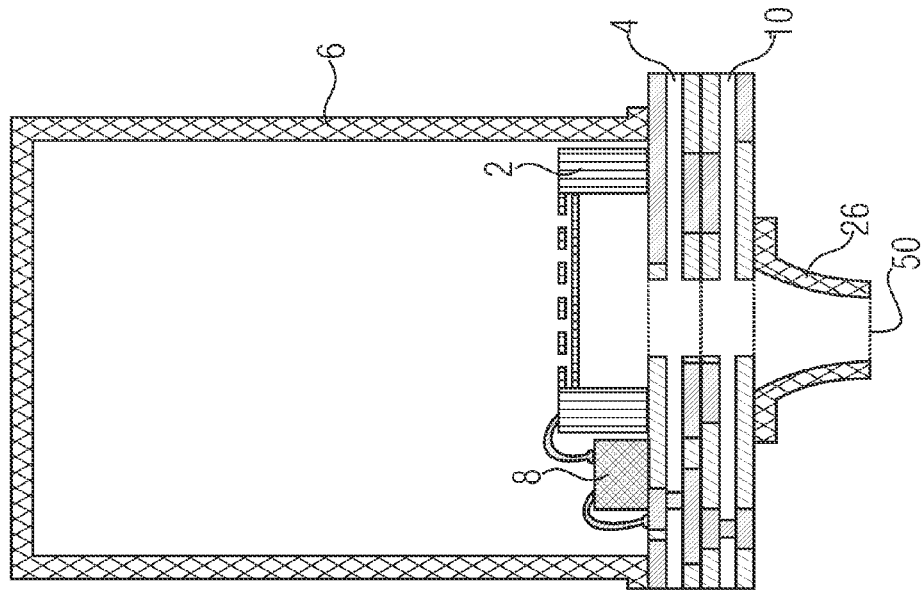
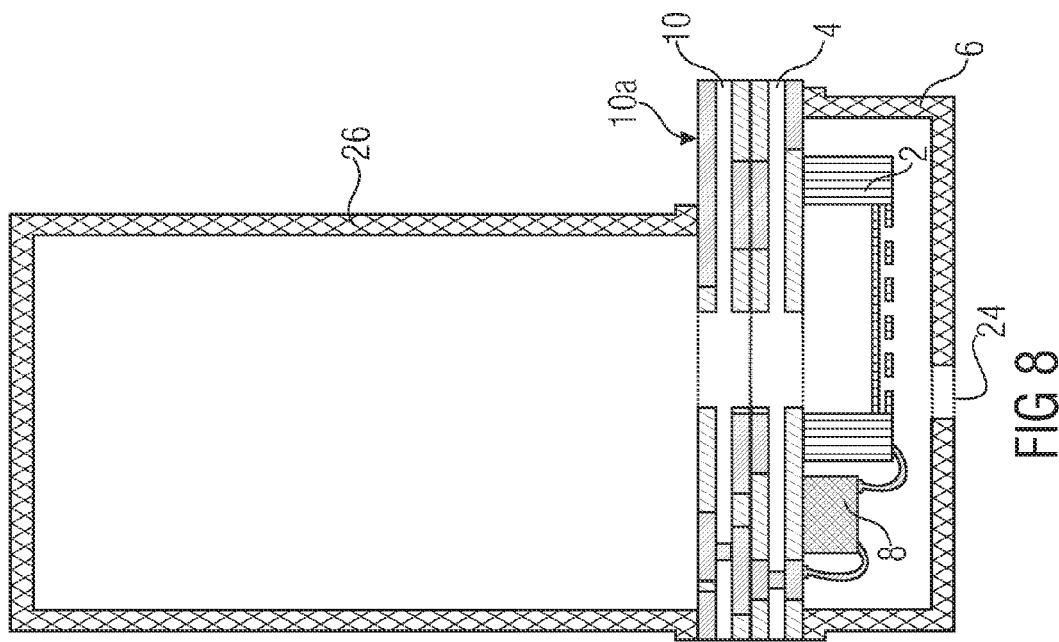

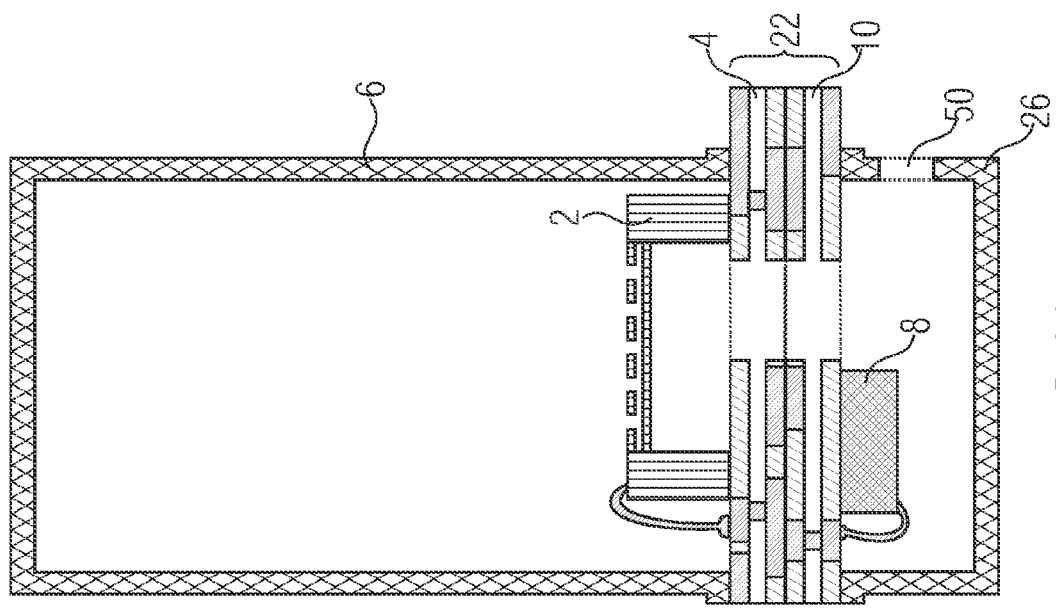

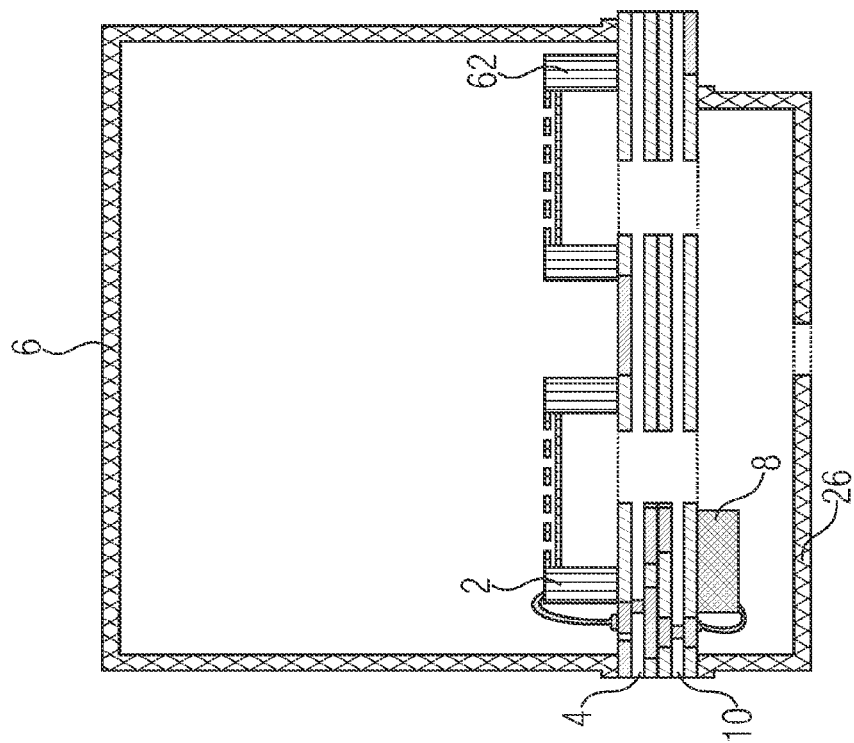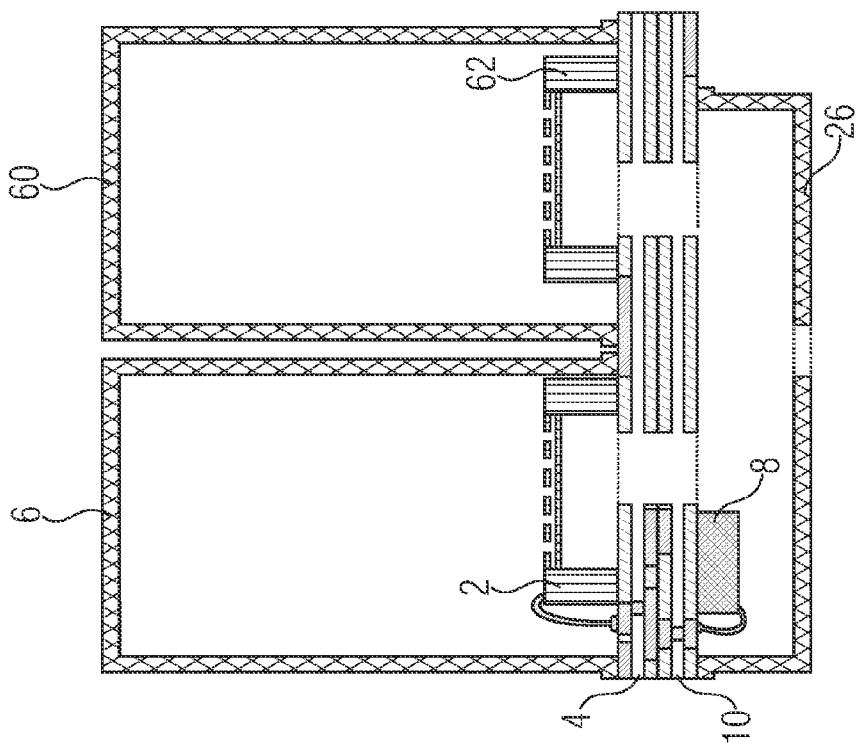
FIG 11

MEMS MICROPHONE PACKAGING AND MEMS MICROPHONE MODULE

TECHNICAL FIELD

Embodiments of the present invention relate to efficient ways to produce microphone modules utilizing MEMS microphones and to improved MEMS microphone modules.

BACKGROUND

Acoustical sensor modules based on MEMS (micro electromechanical structures) microphones are required to be packaged in order to avoid damage to the sensitive sensors. That is, typically, a housing is placed around the sensor itself, which in turn influences the performance of the sensor as, for example, the sensitivity, the signal-to-noise ratio (SNR) or the frequency characteristics of the sensor might be influenced.

SUMMARY OF THE INVENTION

According to several embodiments of the present invention, a MEMS microphone module is produced by arranging a MEMS microphone on a first surface of a first substrate, which also receives a cap mounted to the first surface, such that the cap encloses the MEMS microphone structure. Other components required to produce a functional microphone module, such as, for example, a readout device or a further cap structure are arranged on a first surface of a second, different substrate. The first and the second substrate are attached to each other such that both substrates are attached via their second surfaces, which are opposite to the first surface including the components.

Embodiments of the inventive methods, therefore, have the advantage that the nearly arbitrary geometries of MEMS microphone modules can be created, thereby, for example, providing MEMS microphones with minimal footprints, high signal-to-noise ratio and maximum flexibility in arranging the electrical contacts and/or the inlet openings for the acoustic sound pressure.

According to several embodiments of the present invention, a microphone module is thus provided, which has arranged a MEMS microphone structure on a first surface of a substrate structure, wherein a readout device for the MEMS microphone structure is arranged on the second surface of the substrate structure, which is opposite to the first surface. The MEMS microphone structure may be enclosed by a cap also arranged on the first substrate. According to several embodiments, microphone modules can thus be provided having a minimum footprint that is consuming a minimal area by placing different functional components on different sides of a common substrate.

According to further embodiments, a further cap structure is arranged on the opposite side of the substrate structure containing the MEMS microphone structure. Thus, the inlet for the acoustical pressure may be positioned with maximum flexibility, thus providing the possibility to achieve a high signal-to-noise ratio.

BRIEF DESCRIPTION OF THE DRAWINGS

Several embodiments of the present invention are subsequently described by referring to the enclosed figures, wherein:

FIGS. 1A to 1D, collectively

FIGS. 3A and 3B, collectively

FIGS. 4A and 4B, collectively

FIGS. 5A and 5B, collectively

FIG. 6 shows an embodiment of a microphone module having multiple pressure openings;

FIG. 7 shows a further embodiment of a microphone module;

FIG. 8 shows an embodiment of a microphone module having two cap structures on different sides of a substrate;

FIG. 9 shows a further embodiment of a microphone module having two cap structures on different sides of a substrate;

FIG. 10 shows a further embodiment of a microphone module;

FIGS. 11A and 11B, collectively FIG. 11, show embodiments of a microphone module comprising two MEMS microphone structures;

DETAILED DESCRIPTION OF ILLUSTRATIVE EMBODIMENTS

Figure 1:
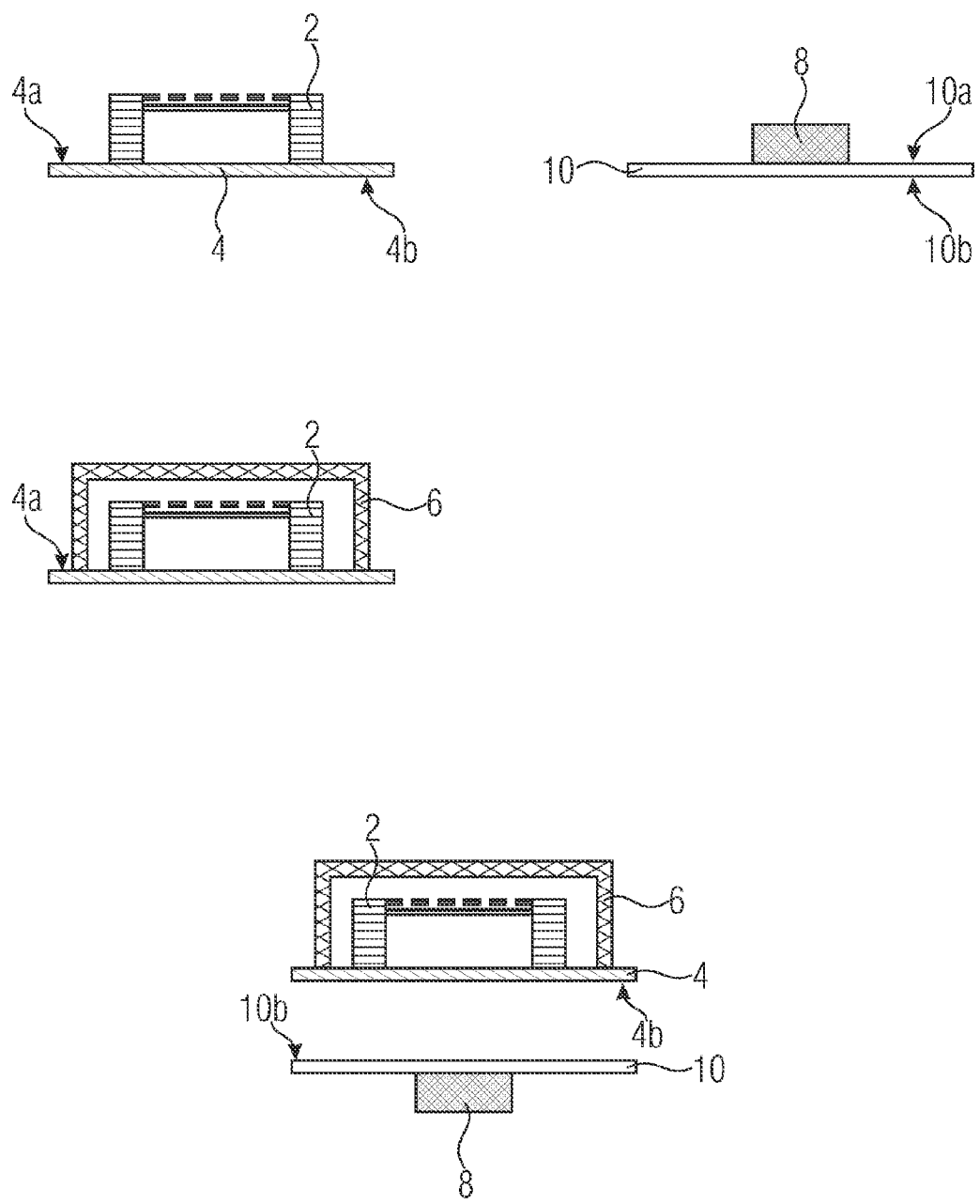
FIG. 1, show an embodiment of a method for producing a microphone module.

FIG. 1 shows an embodiment of a method for producing a microphone module. According to this method, a MEMS microphone structure 2 is arranged on a first surface 4a of a first substrate 4. A cap 6 is furthermore arranged on the first surface 4a, such that the cap 6 and the first surface 4a enclose the MEMS microphone structure 2 such that the MEMS microphone structure 2 may be protected from being damaged. It may, however, be noted that the sealing of the cap is not necessarily hermetical such that, according to some embodiments, pressure may enter the volume enclosed by the cap 6.

A readout device 8 for the MEMS microphone structure 2 is arranged on a first surface 10a of a second substrate 10. In order to associate the readout device 8 with the MEMS microphone structure 2, the first substrate 4 and the second substrate 10 are attached to each other such that they are attached with their second surfaces 4b and 10b, respectively. As it becomes apparent from the previously described embodiment, the components of a MEMS microphone module, which has a rather complicated geometry can be manufactured in a simple to implement planar-technology. Despite using only simple planar-technology, complicated geometries can be achieved by arranging different components of the microphone module on separate substrates and by then attaching the separate substrates to one another in order to provide the microphone module. Although illustrated with only two substrates in FIG. 1, it goes without saying that the method could also be implemented with more than two substrates, such that, for example, two separate substrates may be attached to the first substrate 4, each of the two substrates having provided thereon different additional components. The attaching of the surfaces of the first and second substrate 4, 10 can be performed by any method providing an appropriate interconnection between the two substrates. This could, for example, be performed by gluing or soldering the substrates together. Other possible ways to attach the substrates to each other are welding, crimping, press-fitting or the like. The substrate may be any material suited to support the components of a MEMS-microphone module, such as, for example, a PCB (printed circuit board), a silicon wafer, polysilica any kind of meal or plastics or the like.

According to some embodiments, the first substrate 4 and the second substrate 10 include printed circuits and vias extending from the first surface to the second surface of each substrate in order to provide the possibility to electrically interconnect the MEMS microphone structures to a corresponding readout device 8 via contact areas on the second surfaces of the substrate. Therefore, attaching the second surface of the first substrate to the second surface of the second substrate may be performed such that the vias and the contact areas on the second surfaces of the two substrates 4 and 10 are conductively connected to each other. This could, for example, be achieved by soldering or by using conductive glue.

By prearranging certain components of a microphone module on different substrates or by arranging different components on two opposite sides of a common substrate, complex application-specific geometries of microphone modules can be achieved, as it will become apparent from the subsequently discussed production methods and microphone modules. It may be noted that the arranging of the MEMS microphone structure 2 on the first surface 4a of the first substrate 4 might make use of one of the previously discussed methods to interconnect the two substrates 4 and 10. That is, a MEMS microphone structure 2 may be arranged and fixed by soldering, gluing, welding, crimping or press-fitting or the like. In embodiments that include printed circuits within the substrates, the arranging of the MEMS microphone structure 2 may furthermore include electrically interconnecting the MEMS microphone structure 2 to the printed circuit of the substrate. This may include conductively connecting a contact of the MEMS microphone structure 2 to a contact structure of the first substrate 4 which extends from the first surface 4a to the second surface 4b of the first substrate. Accordingly, also the arranging of the readout device may include the conductive connecting of associated contacts of the readout device to further contact structures of the second substrate, which may extend from the first surface 10a of the second substrate 10 to the second surface 10b of the second substrate.

Consequently, attaching the second surface 4b of the first substrate 4 to the second surface 10b of the second substrate 10 may include the aligning of the contact structures of the first substrate 4 with the contact structures of the second substrate 10, such that electrical interconnections between the two substrates may be achieved.

According to further embodiments of the present invention, the method for producing a microphone module further includes the creation of a sound opening in the cap 6, such that pressure waves (acoustic pressure waves) may enter the volume enclosed by the cap 6 and the first surface 4a. The MEMS microphone structure 2 may be preproduced in a preceding process and provided as a functional structure that includes a membrane to be excited by the acoustic pressure and an electrode being fixed with respect to the membrane such as to be able to measure an altering capacitance of the MEMS microphone structure.

By arranging different components of a MEMS microphone structure on different substrates and by then attaching the two substrates to each other, microphone modules with smaller footprints may be produced as compared to techniques where the components are mounted only on one side of a substrate using planar-technology. Furthermore, nearly arbitrary geometries are feasible using such an approach, as the subsequent embodiments of the microphone modules will illustrate.

Figure 2:
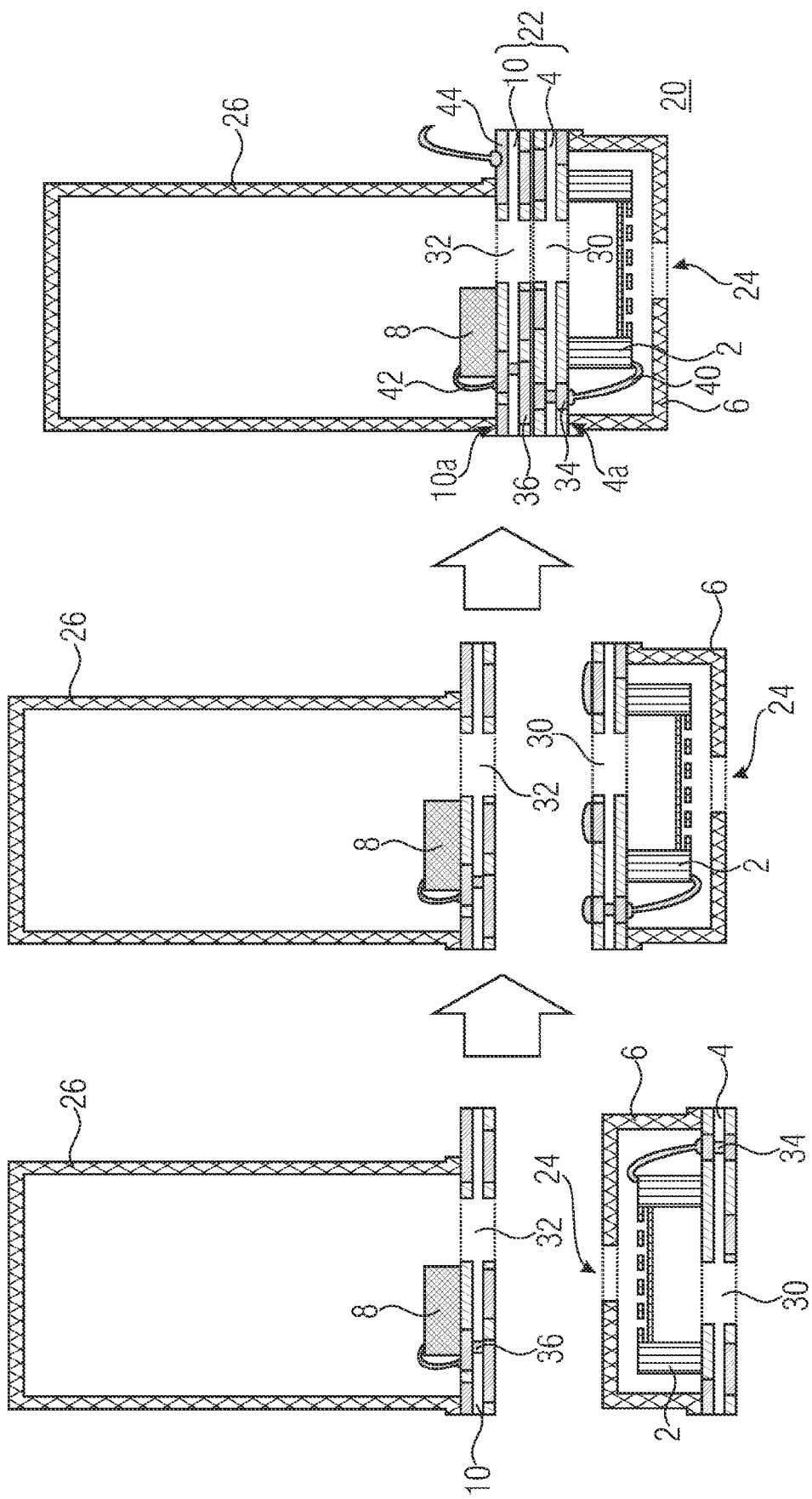
FIG. 2 shows an embodiment of a microphone module.

FIG. 2 shows a further embodiment of a microphone module 20 and the associated method for producing a microphone module. The microphone module 20 includes a substrate structure 22, that includes a first substrate 4 and a second substrate 10. A MEMS microphone structure 2 is arranged on the first surface 4a of the first substrate and a readout device 8 for the MEMS microphone structure 2 is arranged on a first surface 10a of the second substrate. A cap 6 is arranged on the first surface 4a of the first substrate 4 such that the cap 6 encloses the MEMS microphone structure 2. According to the embodiment of FIG. 2, the cap 6 furthermore includes a sound opening 24, in order to allow the acoustic pressure waves to enter the volume enclosed by the cap 6. The embodiment of a microphone module 20 according to FIG. 2 further includes a second cap (structure) 26 arranged on a second surface 10a of the substrate structure 22 such that the readout device 8 is enclosed by the second cap 26. In the embodiment of FIG. 2, the second surface 10a of the substrate structure 22 corresponds to the first surface 10a of the second substrate 10, since the two substrates 4 and 10 are mounted on top of each other such, that the first surfaces of each of the substrates form the surfaces of the substrate structure 22.

The microphone module 20 furthermore includes a first sound opening 30 in the first substrate 4 which extends from the first surface 4a to the second surface of the first substrate 4 underneath the MEMS microphone structure 2. That is, the sound opening extends through the complete substrate 4 in the area, which is covered by the MEMS microphone structure 2. The microphone module 20 furthermore includes a second sound opening 32, which extends from the first surface 10a to the second surface of the second substrate 10. According to the specific embodiment of FIG. 2, the second sound opening 32 is placed in an area which is covered by the second cap 26. The first and the second sound openings 30 and 32 are aligned with respect to each other, such that a sound opening extending from the first surface 4a to the second surface 10a of the substrate structure 22 is provided. Such, a rear volume of the MEMS microphone module 2 can be provided, which is big enough in order to not significantly reduce the signal-to-noise ratio of the microphone module due to compression effects of the backside volume of the membrane of MEMS microphones. This, however, can be achieved without increasing the footprint (the overall area covered by the microphone module on the surfaces of the substrate) of the microphone module.

In order to electrically connect the MEMS microphone structure 2 to the readout device 8 placed on different sides of the substrate structure 22, the first substrate 4 as well as the second substrate 10 include contact structures. The first substrate 4 includes a first contact structure 34 extending from the first surface 4a to the second surface 4b of the first substrate 4. The second substrate 10 includes a second contact structure 36, which extends from the first surface 10a to the second surface 10b of the second substrate 10. The first and the second contact structures 34 and 36 are aligned with respect to each other, such that while attaching the surfaces of the first and second substrates to each other, an electrical contact between the two contact structures is provided. The electrical contact may be provided by using conductive glues or by soldering or welding the two substrates to each other. A contact of the MEMS microphone structure 2 is conductively connected to the first contact structure 34 of the first substrate 4 by a bonding wire 40 whereas an associated contact of the readout device 8 is conductively connected to the second contact structure 36 of the second substrate 10 via a bonding wire. Thus, the readout device 8 and the MEMS microphone structure 2 are connected to each other for the MEMS microphone structure 2 to be read by out by the readout device 8.

The second substrate 10 furthermore includes an external contact area 44, which may, via printed circuits connect to the second contact structure 42. The external contact area 44 is placed outside the second cap 26 such that electrical contacts can be provided to the outside of the MEMS microphone structure.

The microphone module 20 is produced according to the previously described method of FIG. 1, which further includes the optional steps of arranging the second cap 26 on the first surface 10a of the second substrate 10 such that the second cap 26 and the first surface 10a of the second substrate 10 enclose the readout device 8. Furthermore, a first sound opening 30 is created in the first substrate 4 such that the first sound opening 30 extends from the first surface 10a to the second surface 10b of the first substrate 4 and a second sound opening 32 is created in the second substrate 10 such that the second sound opening 32 extends from the first to the second surface of the second substrate 10.

A contact of the MEMS microphone structure 2 is conductively connected to a contact structure 34 of the first substrate 4 which extends from the first surface 4a to the second surface 4b of the first substrate 4 and thus through the complete first substrate 4. Furthermore, an associated contact of the readout device 8 is conductively connected to the second contact structure 36 of the second substrate 10, which extends from the first surface 10a to the second surface 10b of the second substrate 10. The so prepared first and second substrates are attached to each other by attaching the second surface 4b of the first substrate 4 to the second surface 10b of the second substrate 10 such, that the sound openings 30 and 32 and the contact structures 34 and 36 are aligned with respect to each other.

Figure 3:
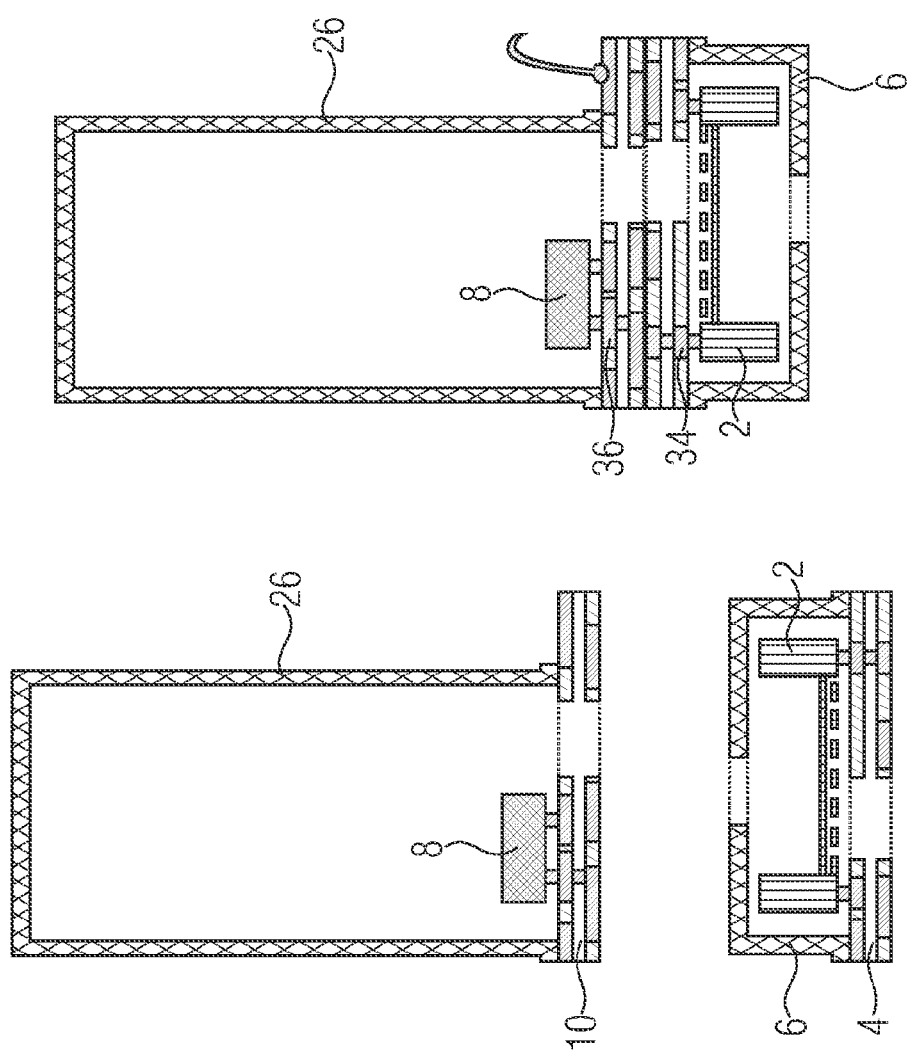
FIG. 3, show a further embodiment of a microphone module.

FIG. 3 shows a further embodiment of the present invention, including mainly the same features as previously discussed with respect to FIG. 2. Therefore, the following description will only indicate the differences with respect to the embodiment of FIG. 2. The embodiment of FIG. 3 may be produced utilizing the same method used for an embodiment according to FIG. 2. The geometrical arrangement of the embodiment of the microphone module illustrated in FIG. 3 corresponds to the one of the embodiment of FIG. 2 with the difference that the MEMS microphone structure 2 is mounted in a different orientation with respect to the first surface 4a of the first substrate 4. The functionality, however, is similar and also a great background volume is provided in the embodiment of FIG. 3. By mounting the MEMS microphone structure 2 in the flipped orientation, one may save the step of bonding the electrical contacts of the MEMS microphone structure 2 to the contact structure 34. This may serve to further decrease the production complexity and the footprint of the microphone module. The readout device 8 may also be directly connected to the second contact structure 36, which may be achieved by soldering or using CPU-like sockets press-fitting the readout device 8 to the corresponding contacts. As in all embodiments discussed herein, the readout device 8 may be implemented by an ASIC, an FPGA, a microprocessor or any other circuitry suited to evaluate the capacitance or any other characteristic of the MEMS microphone structure 2.

Figure 4:
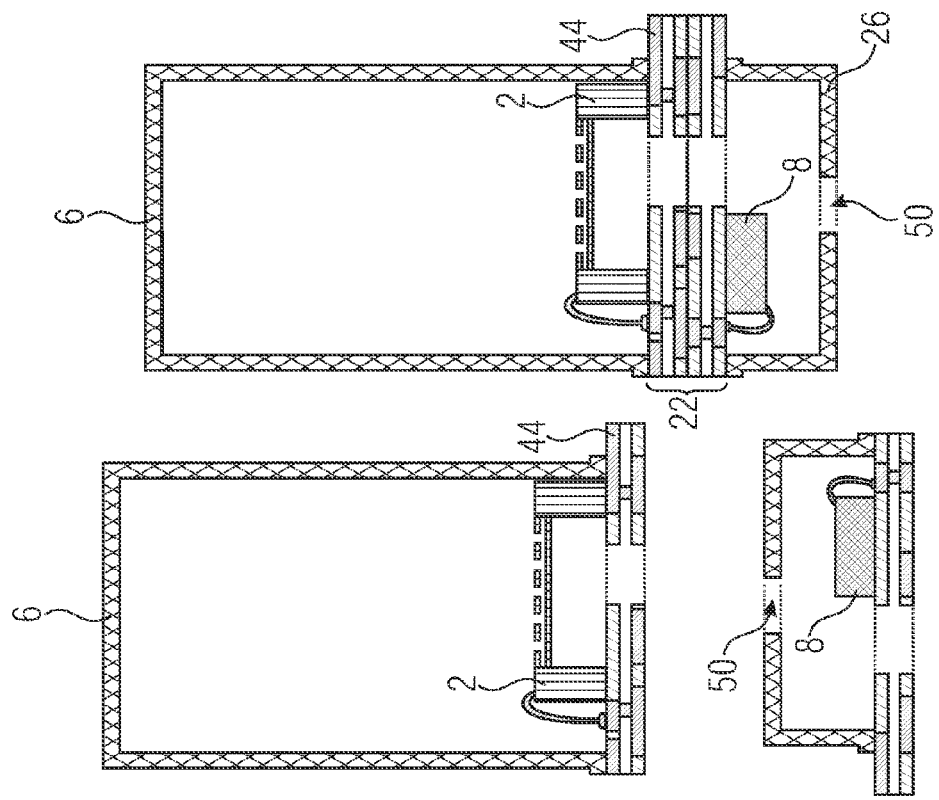
FIG. 4, show a further embodiment of a microphone module.

The embodiment of FIG. 4 differs from the embodiment of FIGS. 3 and 2 in that the readout device 8 has a covering cap 26, which includes a sound opening 50 in order to provide a possibility for the sound pressure to enter the microphone module. That is, the sound opening 50 is placed on the side of the readout device 8, which is easily feasible given the great flexibility of the various embodiments of the methods for producing microphone modules provide.

Figure 5:
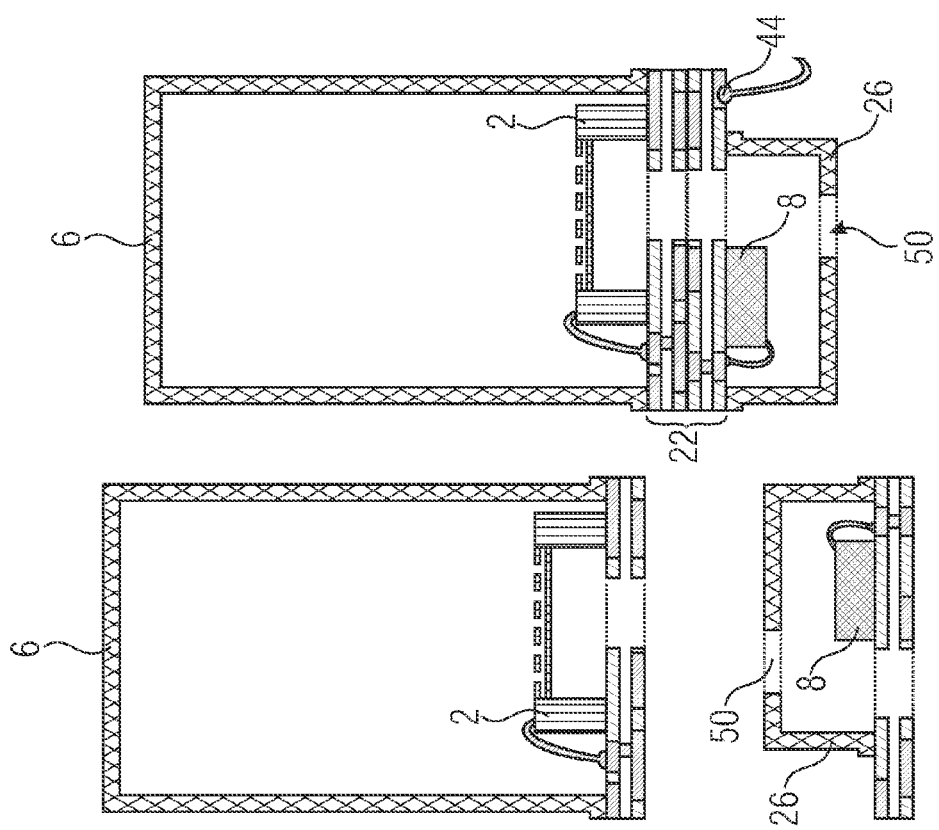
FIG. 5, show another embodiment of a microphone module.

FIG. 5 has the same basic geometry as the embodiment of FIG. 4. However, an external contact 44 is provided on the surface 4a opposite to the readout device 8, which may be a necessity in some applications. The possibility to provide the external contacts 44 anywhere on the surfaces of the substrate structure 22 or of both substrates 4 and 10 is provided by the embodiments of methods for producing microphone modules.

The embodiment of a MEMS microphone module illustrated in FIG. 6 differs from the embodiment of FIG. 5 in that also the first cap 6 of the first substrate 4 comprises a sound opening 24 or, as in this particular example, multiple sound openings. Providing the second opening creates a microphone module having a directivity characteristic with maximum sensitivity in a predetermined direction.

The embodiment of FIG. 7 differs from the embodiment of FIG. 5 in that the sound opening 50 has a special shape in order to ease the application of the module in, for example, hearing aids. In the particular example of FIG. 7, the cap structure 26 and, in particular, the sound opening 50 thereof, extends cylindrically in a direction perpendicular to the surface of the second substrate 10 (the substrate structure 22). A hose may, therefore, be applied to the cap structure 26 to direct the pressure to the microphone in applications where the microphone module is, for example, mounted inside a housing.

The embodiment of FIG. 8 differs from the embodiment of FIG. 2 in that the MEMS microphone structure 2 as well as the readout device 8 are arranged on the surface of the first substrate 4, whereas a first surface 10a of the second substrate 10 provides a cap structure 26 in order to serve as a background volume to avoid compression artifacts of the MEMS microphone module of FIG. 8.

The embodiment of FIG. 9 differs from the embodiment of FIG. 8 in that the cap structure 26 and the associated sound opening 50 serving as an input for the acoustic pressure waves is provided on the second substrate 10, whereas the cap 6 on the first substrate 4 serves as a background cavity. In order to provide a possibility to connect a hose, the cap structure 26 extends cylindrically from the first surface of the second substrate 10.

In order to be adapted to special demands of the underlying application, the microphone module of FIG. 10 differs from the embodiment of FIG. 5 in that the sound opening 50 is arranged in a sidewall of the cap structure 26. This provides, for example, optimal sensitivity of the microphone module when the sound pressure is mainly imminent from a direction parallel to the surfaces of the first substrate 4 and the second substrate 10, (the substrate structure 22), which may, for example, be the case when installing the MEMS microphone module in mobile phones or other mobile equipment providing a limited space in one geometrical extension.

The embodiment of FIG. 11 differs from the previously discussed embodiments in that the first substrate 4 comprises two or, in alternate embodiments, more, MEMS microphone structures 2, which are readout by the readout device 8. In the left embodiment of FIG. 11, each of the two MEMS microphone structures 2 and 62 has its own cap 6 and 60, respectively. This may have the advantage that the back volumes of the MEMS microphone structures 2 and 62 are decoupled from each other such that the two MEMS microphone structures 2 and 62 may not influence each other, while the sensitive area, that is the membrane area, of the microphone module can be doubled. According to the second embodiment illustrated in FIG. 11, the MEMS microphone structures 2 and 62 share a common cap 6, thus reducing production complexity while, at the same time, doubling the membrane space.

Figure 12:
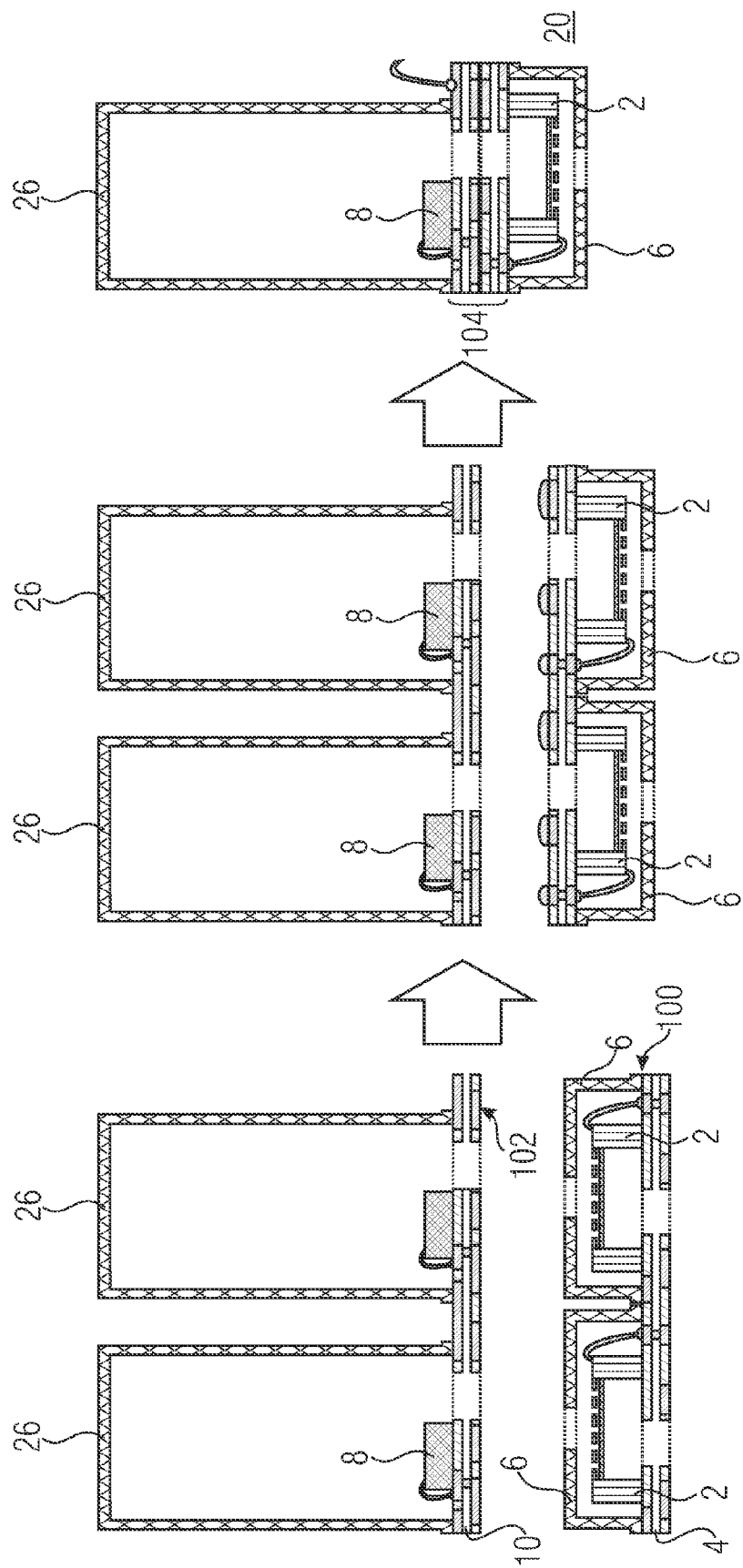
FIG. 12 shows an embodiment of a method for producing a microphone module.

The embodiment of FIG. 12 illustrates an embodiment of a method for producing a microphone module, which is based on the method described in FIG. 1. Providing the MEMS microphone structure 2 and the readout device 8 together with its corresponding caps 6 and 26 on different substrates before attaching the substrates provides for the possibility to completely process a bigger common substrate to apply multiple MEMS microphone structures 2 or readout devices 8 on a common substrate 100 and 102. After providing the two substrates 100 and 102 with multiple MEMS microphone structures 2 and readout devices 8, the common substrates 100 and 102 can be attached to each other, thus generating multiple microphone modules at a time, as indicated in FIG. 12. The common substrates 100 and 102 or the generated common substrate structure 104 can be divided into parts after having attached both common substrates 100 and 102 to each other. This may be achieved by sawing, etching or other techniques suited to divide the common substrates into multiple pieces in a controlled manner, such that finally multiple MEMS microphone modules as already discussed with respect to FIG. 2 can be provided. That is, by providing different components of the microphone modules on separate substrates prior to attaching the substrates to each other not only provides for the possibility to implement arbitrary geometries, but also serves to increase the production efficiency to a great extent.

Figure 13:
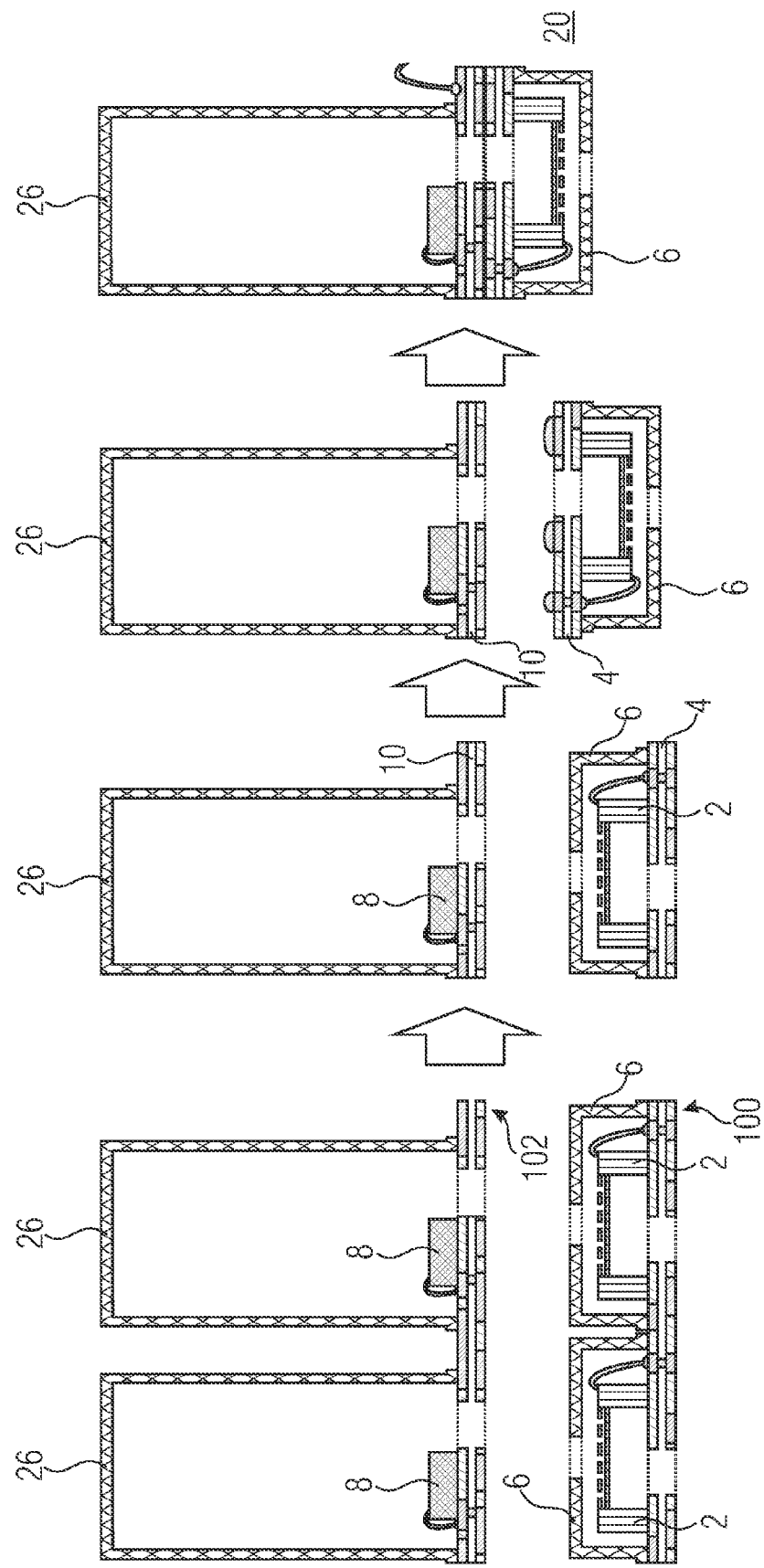
FIG. 13 shows another embodiment of a method for producing a microphone module.

FIG. 13 shows a further embodiment of a method to produce a microphone module, where the common substrates 100 and 102 are divided into the substrates 4 and 10 associated to each microphone module before the substrates 4 and 10 are attached to each other.

Figure 14:
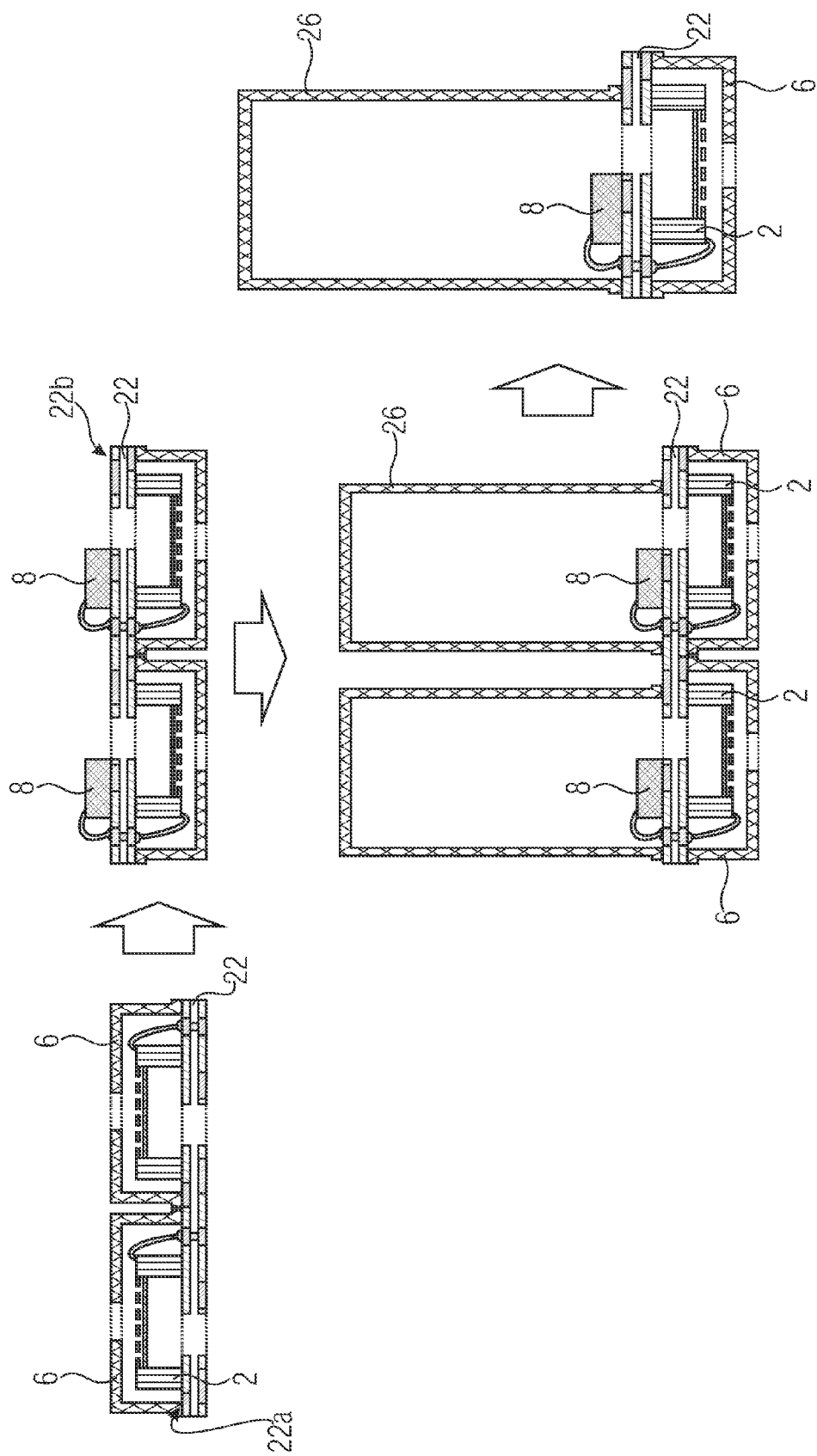
FIG. 14 shows an embodiment of a method for producing a microphone module on a common substrate.

FIG. 14 shows an embodiment of a method for producing a MEMS microphone module, where the MEMS microphone structure 2 is arranged on a first surface 22a of a common substrate 22 and where readout device 8 is arranged on the second surface 22b of the common substrate 22. Furthermore, a cap 6 enclosing the MEMS microphone structure 2 is provided on the first surface 22a of the common substrate 22, whereas a cap structure 26 enclosing the readout device 8 on the second surface 22b of the common substrate 22 is provided. By providing the different components on opposite sides of a common substrate 22, the maximum flexibility in the custom design of the microphone module can be preserved such as to achieve, for example, excellent signal-to-noise ratios with small footprints and full customization with respect to the positions of the sound openings and the external contacts of the generated MEMS microphone module.

Although several particular embodiments have been discussed with respect to the figures, it should again be emphasized that the implementation of the inventive methods is suitable to provide also microphones modules with other arbitrary geometries, which may be fully custom-fit to the requirements of the particular application. It is therefore emphasized that arbitrary combinations of the features disclosed in the previous embodiments can be generated and therefore, it is understood, that microphone modules consisting of an arbitrary combination of features of the previously described embodiments are also disclosed herewith.

According to the great flexibility, the MEMS microphone modules may be custom-fit to any desired application, such as, for example, the application in mobile phones, laptop computers, webcams, computer or television displays, directional microphones for teleconferencing, computer headsets, external microphones for mobile phones, hearing aids or the like.

What is claimed is:

1. A method for producing a microphone module, the method comprising:
   arranging a MEMS microphone structure on a first surface of a first substrate, the first substrate further comprising a second surface, which is opposite to the first surface;
   arranging a cap on the first surface of the first substrate such that the cap and the first surface enclose the MEMS microphone structure;
   arranging a readout device for the MEMS microphone structure on a first surface of a second substrate, the second substrate further comprising a second surface, which is opposite to the first surface; and
   attaching the second surface of the first substrate, which comprises the MEMS microphone structure on the first surface, to the second surface of the second substrate, which comprises the readout device on the first surface.

2. The method according to claim 1, further comprising:
   arranging a second cap on the first surface of the second substrate such that the second cap and the first surface of the second substrate enclose the readout device.

3. The method according to claim 1, further comprising:
   creating a sound opening in the cap such that sound waves can enter a volume enclosed by the cap and the first surface.

4. The method according to claim 2, further comprising:
   creating a sound opening in the second cap such that sound waves can enter a volume enclosed by the first surface of the second substrate and the second cap.

5. The method according to claim 1, further comprising:
   creating a first sound opening in the first substrate, the first sound opening extending from the first surface to the second surface of the first substrate in an area that is covered by the MEMS microphone structure.

6. The method according to claim 5, further comprising:
   creating a second sound opening in the second substrate, the second sound opening extending from the first surface to the second surface of the second substrate.

7. The method according to claim 1, wherein attaching further comprises aligning a first sound opening that extends from the first surface to the second surface of the first substrate and a second sound opening that extends from the first surface to the second surface of the second substrate.

8. The method according to claim 1, wherein attaching comprises gluing, soldering or crimping.

9. The method according to claim 1, further comprising:
   conductively connecting a contact of the MEMS microphone structure to a contact structure of the first substrate, the contact structure extending from the first surface to the second surface of the first substrate; and
   conductively connecting an associated contact of the readout device to a second contact structure of the second substrate, the second contact structure extending from the first surface to the second surface of the second substrate.

10. The method according to claim 9, wherein attaching further comprises electrically connecting the first and the second contact structures at the second surfaces of the first and second substrates.

11. The method according to claim 4, wherein the sound opening is created such that the sound opening extends from a surface of the second cap in a cylindrical shape.

12. The method according to claim 1, further comprising:
   arranging a second MEMS microphone structure on the first surface of the first substrate.

13. A method for producing a microphone module, the method comprising:

arranging a MEMS microphone structure on a first surface of a first substrate, the first substrate further comprising a second surface, which is opposite to the first surface;

arranging a cap on the first surface of the first substrate such that the cap and the first surface enclose the MEMS microphone structure;

arranging a cap structure on a first surface of a second substrate, the second substrate further comprising a second surface, which is opposite to the first surface; and attaching the second surface of the first substrate, which comprises the MEMS microphone structure on the first surface, to the second surface of the second substrate, which comprises the cap structure on the first surface.

14. The method according to claim 13, further comprising:
arranging a readout device for the MEMS microphone structure on the second surface of the second substrate.

15. The method according to claim 13, further comprising:
arranging a readout device for the MEMS microphone structure on the first surface of the first substrate.

16. The method according to claim 13, wherein attaching further comprises:
aligning a first sound opening in the first substrate extending from the first surface to the second surface of the first substrate with a second sound opening in the second substrate extending from the first surface to the second surface of the second substrate.

17. A microphone module, comprising:
a substrate structure comprising a first surface and a second surface, which is opposite to the first surface, the substrate structure comprising a first substrate comprising the first surface of the substrate structure as its first surface, the first substrate further comprising a second surface, which is opposite to the first surface of the first substrate, and a second substrate comprising the second surface of the substrate structure as its first surface, the second substrate further comprising a second surface, which is opposite to the first surface of the second substrate, a MEMS microphone structure arranged on the first surface;

a cap arranged on the first surface such that the MEMS microphone structure is enclosed by the cap and the first surface; and a readout device for the MEMS microphone structure arranged on the second surface.

18. The microphone module according to claim 17, wherein the second surface of the first substrate and the second surface of the second substrate are attached to each other.

19. The microphone module according to claim 17, further comprising:
a second cap arranged on the second surface of the substrate structure such that the second cap and the second surface enclose the readout device.

20. The microphone module according to claim 17, further comprising:
a second MEMS microphone structure arranged on the first surface of the substrate structure, wherein the cap also encloses the second MEMS microphone structure.

21. The microphone module according to claim 17, further comprising a sound opening in the cap.

22. The microphone module according to claim 19, further comprising a sound opening in the cap and a second sound opening in the second cap.

23. A microphone module, comprising:
a first substrate having a first surface and a second surface, which is opposite to the first surface;

a second substrate having a first surface and a second surface, which is opposite to the first surface, wherein the second surface of the first substrate is attached to the second surface of the second substrate;

a MEMS microphone structure arranged at the first surface of the first substrate;

a cap arranged at the first surface of the first substrate such that the cap and the first surface enclose the MEMS microphone structure; and a cap structure arranged at the first surface of the second substrate.

24. The microphone module according to claim 23, further comprising a sound opening extending from the first surface of the first substrate to the second surface of the second substrate, wherein the cap structure is arranged on the first surface of the second substrate such that the cap structure covers the sound opening.

25. The microphone module according to claim 24, wherein the cap structure extends cylindrically from the first surface of the second substrate.

26. A method for producing a microphone module, the method comprising:
providing a first substrate having a first surface and a second surface, which is opposite to the first surface, wherein a MEMS microphone structure and a cap are arranged on the first surface such that the MEMS microphone structure is enclosed by the cap and the first surface;

providing a second substrate having a first surface and a second surface, which is opposite to the first surface, wherein a readout device for the MEMS microphone structure is arranged on the first surface of the second substrate; and attaching the second surface of the first substrate, which comprises the MEMS microphone structure on the first surface, to the second surface of the second substrate, which comprises the readout device on the first surface.

* * * * *